US012610469B2

(12) United States Patent (10) Patent No.: US 12,610,469 B2
Luo et al. (45) Date of Patent: Apr. 21, 2026

(54) INTEGRATED MODULE AND INTELLIGENT DEVICE

(71) Applicant: HUIZHOU VISION NEW TECHNOLOGY CO., LTD., Huizhou (CN)

(72) Inventors: Jiahui Luo, Huizhou (CN); Liuzhong Yin, Huizhou (CN)

(73) Assignee: HUIZHOU VISION NEW TECHNOLOGY CO., LTD., Huizhou (CN)

( * ) Notice: Subject to any disclaimer, the term of this patent is extended or adjusted under 35 U.S.C. 154(b) by 278 days.

(21) Appl. No.: 18/259,769

(22) PCT Filed: Oct. 12, 2021

(86) PCT No.: PCT/CN2021/123306
§ 371 (c)(1),
(2) Date: Jun. 28, 2023

(87) PCT Pub. No.: WO2022/142580
PCT Pub. Date: Jul. 7, 2022

(65) Prior Publication Data
US 2024/0064904 A1 Feb. 22, 2024

(30) Foreign Application Priority Data
Dec. 30, 2020 (CN) .......................... 202023328506.5

(51) Int. Cl.
*H05K 1/02* (2006.01)
*G06F 1/16* (2006.01)
(Continued)

(52) U.S. Cl.
CPC ............. *H05K 1/18* (2013.01); *G06F 1/1698* (2013.01); *H05K 1/0284* (2013.01); *H05K 1/147* (2013.01);
(Continued)

(58) Field of Classification Search
CPC ....... H05K 1/0284; H05K 1/145; H05K 1/147
(Continued)

(56) References Cited

U.S. PATENT DOCUMENTS

| 4,002,953 A | * | 1/1977 | Tetlie | ........................ F16B 2/06 |
| | | | | 361/756 |
| 4,129,390 A | * | 12/1978 | Bigelow | .................... B41J 2/29 |
| | | | | 101/93.48 |

(Continued)

FOREIGN PATENT DOCUMENTS

| CN | 104574702 A | 4/2015 |
| CN | 104577362 A | 4/2015 |

(Continued)

OTHER PUBLICATIONS

International Search Report in International application No. PCT/CN2021/123306,mailed on Jan. 12, 2022.
(Continued)

*Primary Examiner* — Adrian S Wilson
(74) *Attorney, Agent, or Firm* — PV IP PC; Wei Te Chung

(57) ABSTRACT

An integrated module includes a printed circuit board body and a printed circuit board convex portion. The printed circuit board convex portion is arranged on one side of a width extension direction of the printed circuit board body. A second function module with larger volume is arranged on the printed circuit board convex portion, and a first function module with smaller volume is arranged on the printed circuit board body, so that the width of the printed circuit board body may be made smaller, and the width of the printed circuit board body may be made less than 8.5±0.1 mm, thereby realizing the low profile effect during the assembly of the integrated module and avoiding the abrupt conflict of the entire intelligent device caused by the assem-
(Continued)

1000 bly of the integrated module due to the excessive width of the integrated module.

20 Claims, 5 Drawing Sheets

(51) Int. Cl.

| | | |
|---|---|---|
| *H05K 1/14* | (2006.01) | |
| *H05K 1/18* | (2006.01) | |
| *H04W 88/06* | (2009.01) | |

(52) U.S. Cl.
CPC ... *H04W 88/06* (2013.01); *H05K 2201/09027* (2013.01); *H05K 2201/10053* (2013.01); *H05K 2201/10083* (2013.01); *H05K 2201/10098* (2013.01); *H05K 2201/10113* (2013.01); *H05K 2201/10151* (2013.01); *H05K 2201/10522* (2013.01)

(58) Field of Classification Search
USPC .......................................................... 361/760
See application file for complete search history.

(56) References Cited

U.S. PATENT DOCUMENTS

| | | | | |
|---|---|---|---|---|
| 4,235,496 A | * | 11/1980 | Aug ........................ | H01R 31/06 |
| | | | | 439/157 |
| 6,011,699 A | * | 1/2000 | Murray ............... | H04M 1/0216 |
| | | | | 379/433.05 |
| 6,476,753 B1 | | 11/2002 | Hansen et al. | |
| 9,218,561 B2 | * | 12/2015 | Yilmaz ............ | G06K 19/07758 |
| 10,893,337 B2 | * | 1/2021 | Rivera ................. | H04N 21/631 |
| 2005/0120153 A1 | * | 6/2005 | Perez .................... | G06F 13/409 |
| | | | | 710/62 |
| 2012/0214412 A1 | * | 8/2012 | Schlub ................. | H03K 17/955 |
| | | | | 455/41.1 |
| 2014/0139771 A1 | * | 5/2014 | Choi .................... | G02F 1/13452 |
| | | | | 349/43 |
| 2015/0169011 A1 | * | 6/2015 | Bibl .................... | H01L 23/5386 |
| | | | | 345/175 |
| 2016/0324027 A1 | * | 11/2016 | Ahn ........................ | H05K 1/147 |
| 2016/0353173 A1 | * | 12/2016 | Du ....................... | H04N 21/478 |
| 2019/0379945 A1 | * | 12/2019 | Rivera ................. | H04W 76/10 |
| 2020/0350659 A1 | * | 11/2020 | Yin ....................... | H01Q 9/0407 |
| 2021/0305698 A1 | * | 9/2021 | Yin ......................... | H01Q 1/22 |
| 2023/0216217 A1 | * | 7/2023 | Yin .......................... | H01Q 9/42 |
| | | | | 343/702 |

FOREIGN PATENT DOCUMENTS

| | | | | |
|---|---|---|---|---|
| CN | 208227439 U | | 12/2018 | |
| CN | 109117030 A | | 1/2019 | |
| CN | 214046166 U | | 8/2021 | |
| WO | WO-2011090478 A1 | * | 7/2011 | ............. H05K 1/141 |

OTHER PUBLICATIONS

Written Opinion of the International Search Authority in International application No. PCT/CN2021/123306,mailed on Jan. 12, 2022.

* cited by examiner

INTEGRATED MODULE AND INTELLIGENT DEVICE

CROSS REFERENCE TO RELATED APPLICATION

This application is a US national phase application based upon an International Application No. PCT/CN2021/123306, filed on Oct. 12, 2021, which claims priority to Chinese Application No. 202023328506.5, filed on Dec. 30, 2020. The entire disclosures of the above applications are incorporated herein by reference.

FIELD OF THE INVENTION

The present disclosure relates to the technical field of smart devices, more particularly, to an integrated module and a smart device.

BACKGROUND

With the development of science and technology, smart devices have also developed rapidly. There are more and more functions on smart devices. In addition to the core circuit board and power board that control smart devices, there are also many other functional modules, such as wireless module, infrared remote control module, key switch, etc. Because different functional modules have different requirements for location, the internal structure of smart devices on the market at present, these functional modules are divided into different functional modules, and are installed according to the location requirements of each of the functional modules, the overall structure and appearance requirements of smart devices. However, these functional modules need to be electrically connected to the core circuit board through wires, which leads to excessive and complex internal wiring of smart devices.

SUMMARY

Technical Problem

An embodiment of the present disclosure is directed to an integrated module and an intelligent device to solve the technical problem of excessive and complex internal wiring of intelligent devices in the prior art.

Solutions to Problems

Technical Solution

In a first aspect, an embodiment of the present disclosure is directed to an integrated module which comprises:
a first function module;
a second function module; and
a printed circuit board.
The printed circuit board comprises:
a printed circuit board body, where the first function module is arranged on; and
a printed circuit board convex portion, arranged on one side of the printed circuit board body and connected to the printed circuit board body, where the second function module is arranged on.
In a second aspect, another embodiment of the present disclosure is directed to an intelligent device. The intelligent device includes a device body and an integrated module. The integrated module comprises:

a first function module;
a second function module; and
a printed circuit board.
The printed circuit board comprises:
a printed circuit board body, where the first function module is arranged on; and
a printed circuit board convex portion, arranged on one side of the printed circuit board body and connected to the printed circuit board body, where the second function module is arranged on.

Beneficial Effects of the Present Application

Advantageous Effect

The integrated module of the present disclosure is directly integrated with multiple functional modules on the printed circuit board. When the integrated module is installed on the intelligent device, compared with the way of electrical connection through multiple wires in the existing technology, it greatly reduces the complexity of the internal wiring of the intelligent device and also saves costs.

The integrated module of the present disclosure comprises a printed circuit board body and a printed circuit board convex portion. The printed circuit board convex portion is arranged on one side of a width extension direction of the printed circuit board body. The second function module with larger volume is arranged on the printed circuit board convex portion, and the first function module with smaller volume is arranged on the printed circuit board body, so that the width of the printed circuit board body maybe made smaller, and the width of the printed circuit board body may be made less than 8.5±0.1 mm, thereby realizing the low profile effect during the assembly of the integrated module and avoiding the abrupt conflict of the entire intelligent device caused by the assembly of the integrated module due to the excessive width of the integrated module.

The integrated module of the present disclosure has simple structure, convenient and fast assembly, greatly improving production efficiency, and greatly reducing the error rate of factory assembly. At the same time, the integrated module provided by this embodiment has good assembly position, strong reusability and versatility, and is capable of being adapted to multiple models, avoiding the waste caused by one integrated module only corresponding to one model.

BRIEF DESCRIPTION OF THE DRAWINGS

Description of the Drawings

Figure 1:
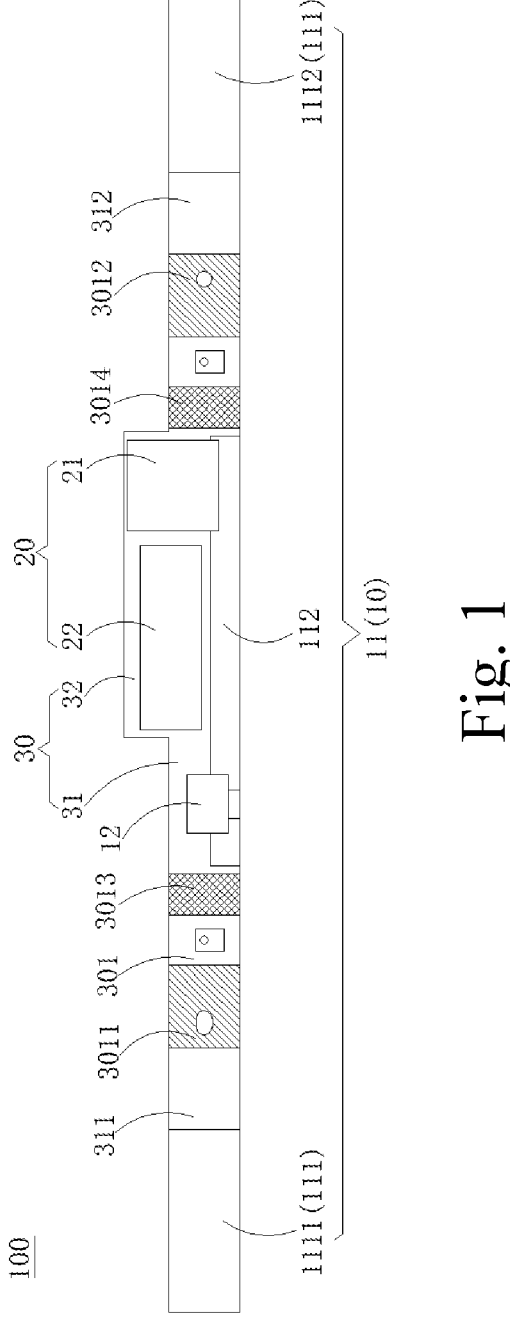

FIG. 1 is a structural diagram of one side of an integrated module according to one embodiment of the present disclosure.

Figure 2:
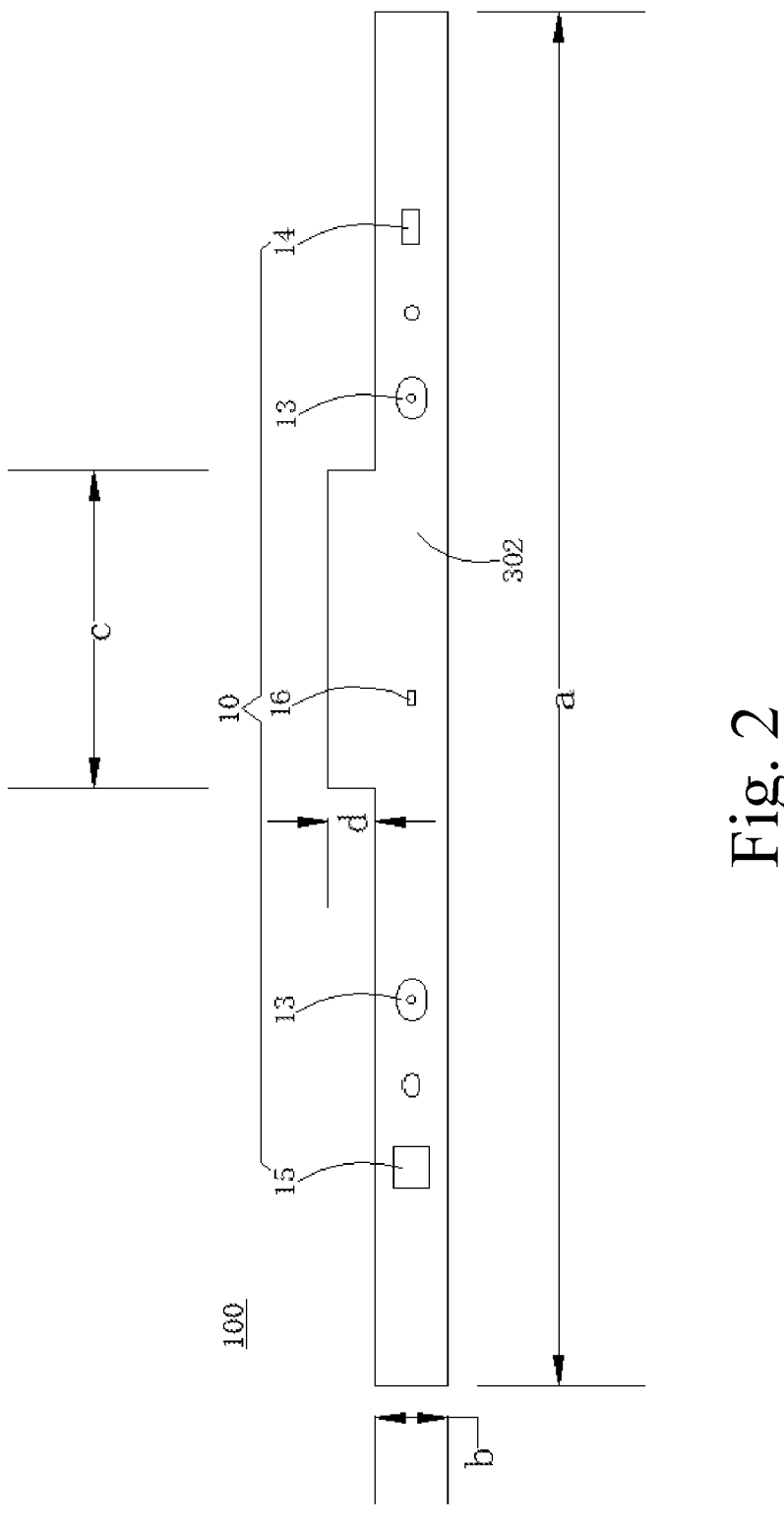

FIG. 2 is the structural diagram of the other side of the integrated module according to one embodiment of the present disclosure.

Figure 3:
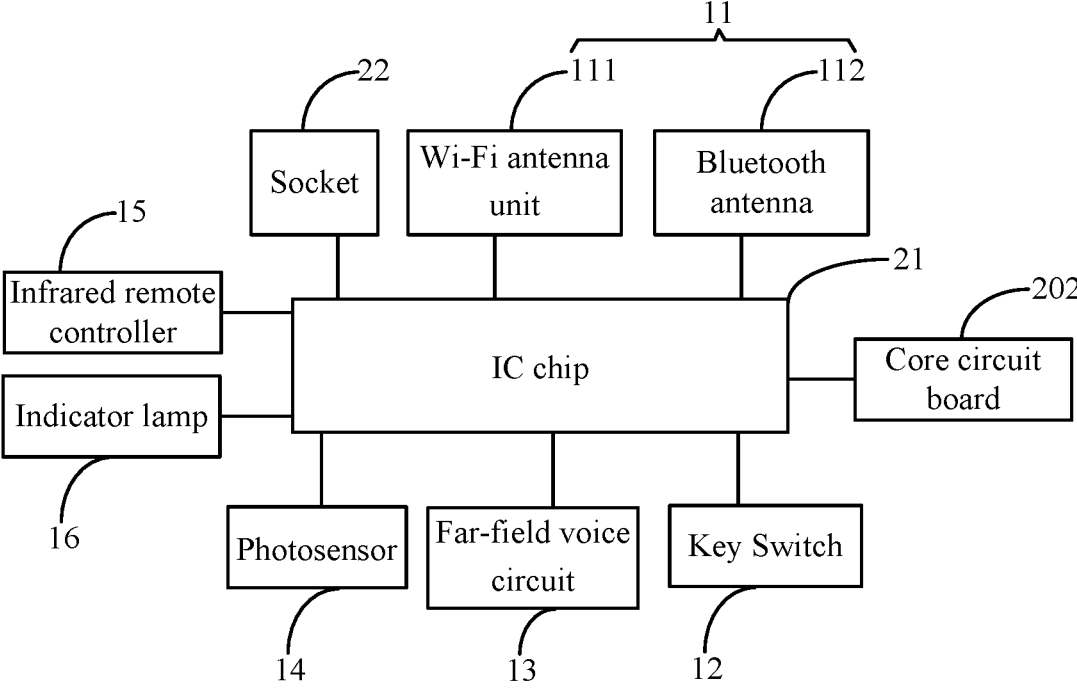

FIG. 3 is the schematic diagram of a functional module of the integrated module according to one embodiment of the present disclosure.

Figure 4:
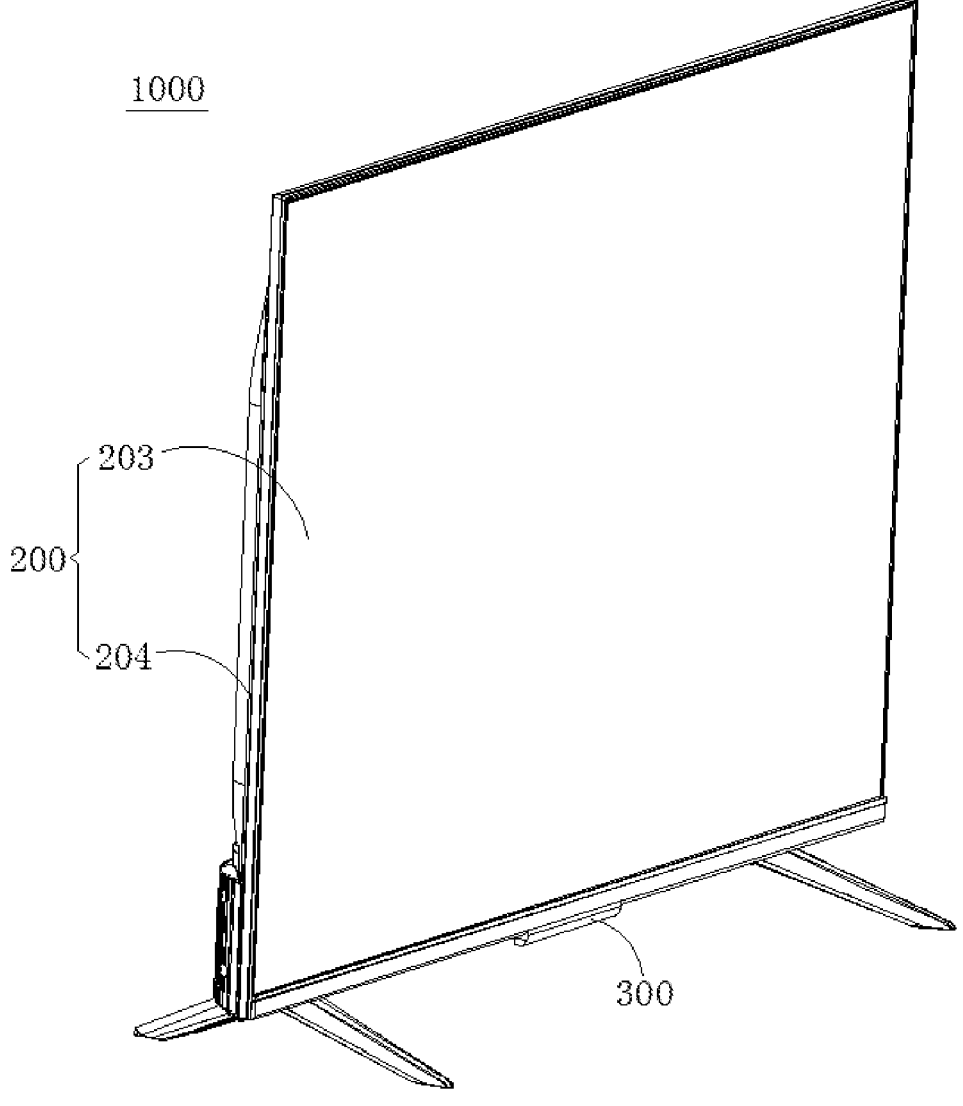

FIG. 4 is the structural diagram of an intelligent device according to one embodiment of the present disclosure.

Figure 5:
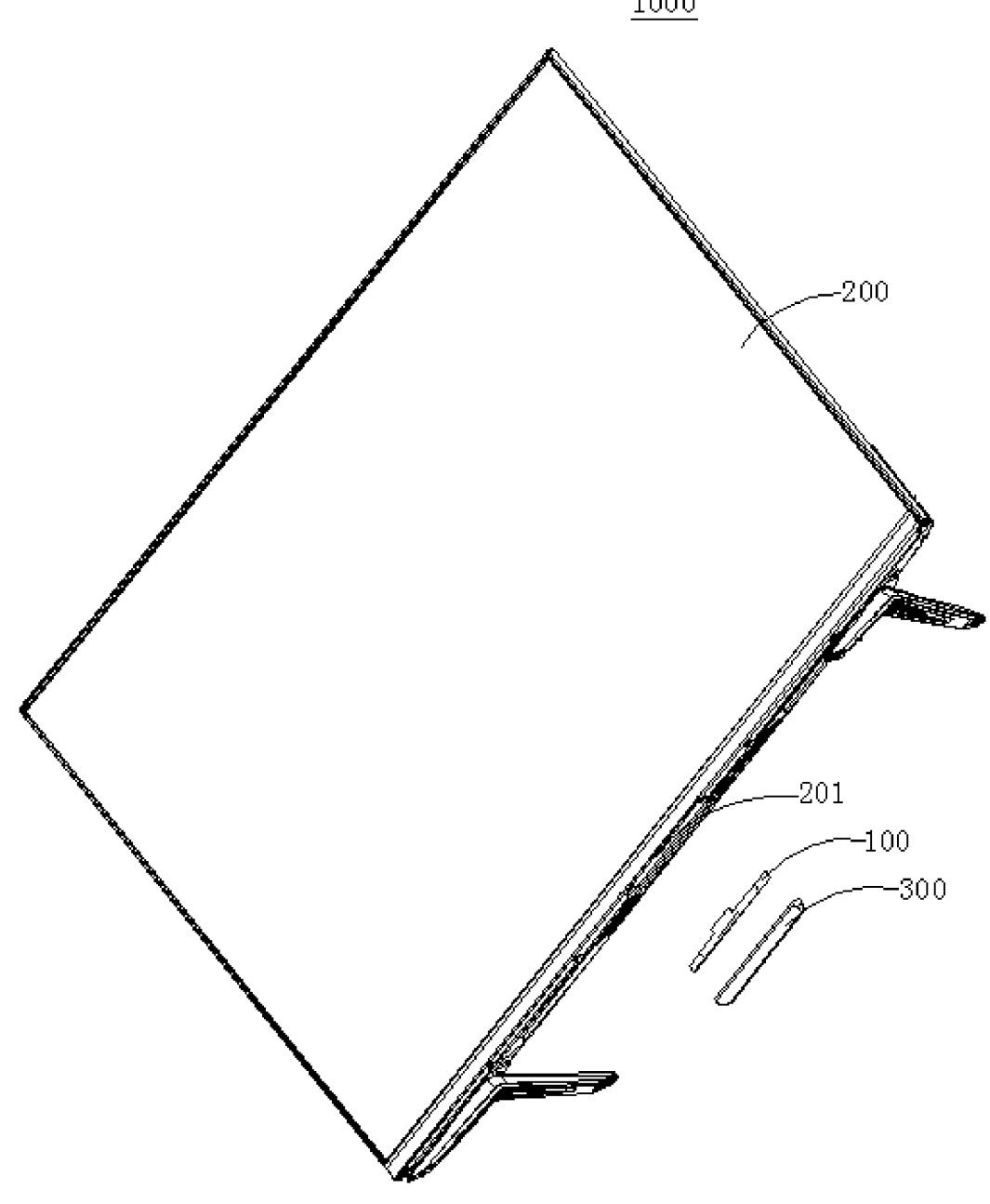

FIG. 5 is an exploded view of the intelligent device according to one embodiment of the present disclosure.

Reference signs in the figures:

| | |
|---|---|
| 100 | Integrated module |
| 10 | First function module |
| 11 | Antenna module |
| 111 | Wi-Fi antenna unit |
| 1111 | First Wi-Fi antenna |
| 1112 | Second Wi-Fi antenna |
| 112 | Bluetooth antenna |
| 12 | Key switch |
| 13 | Far-field voice circuit |
| 14 | Photosensor |
| 15 | Infrared remote controller |
| 16 | Indicator lamp |
| 20 | Second function module |
| 21 | IC chip |
| 22 | Socket |
| 30 | PCB |
| 31 | PCB body |
| 311 | First gap |
| 312 | Second gap |
| 32 | PCB convex portion |
| 301 | First side |
| 3011 | First refuge area |
| 3012 | Second refuge area |
| 3013 | Third refuge area |
| 3014 | Fourth refuge area |
| 302 | Second side |
| 200 | Device body |
| 201 | Insertion portion |
| 202 | Core circuit board |
| 203 | Display |
| 204 | Backplane |
| 300 | Shell |
| 1000 | Intelligent device |

DETAILED DESCRIPTION

Description of the Embodiments

Embodiments of the present disclosure are directed to an integrated module and an intelligent device. In order to make the purpose, technical solution and advantages of the present disclosure clearer and clearer, the present disclosure is further described in detail with reference to the accompanying drawings and examples of embodiments. It should be understood that the specific embodiments described herein are only used to interpret the present disclosure and are not intended to qualify the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

Please refer to FIGS. 1 and 2. In this embodiment, the present disclosure is directed to an integrated module 100, which comprises a plurality of first functional modules 10, a plurality of second function modules 20, and a printed circuit board 30. The printed circuit board (PCB) 30 comprises a printed circuit board body 31 and a printed circuit board convex portion 32. At least one first function module 10 is arranged on printed circuit board body 31. The printed circuit board convex portion 32 is arranged on one side of the printed circuit board body 31 and connected to the printed circuit board body 31. At least one second function module 20 is arranged on the printed circuit board convex portion 32. The printed circuit board body 31 and the printed circuit board convex portion 32 are integrated structures. Each of the first function modules 10 may be connected to the printed circuit board body 31 by the way of patch, or it may be connected to the printed circuit board body 31 of the printed circuit board body 31 by the way of straight insertion. Each of the second function modules 20 may be connected to the printed circuit board convex portion 32 by the way of patch, and may also be connected to the printed circuit board convex portion 32 by the way of straight insertion.

The operation principle of the integrated module 100 is introduced as follows:

The integrated module 100 integrates multiple function modules directly on the printed circuit board 30. When the integrated module 100 is installed on an intelligent device 1000, it greatly reduces the wiring inside the intelligent device 1000. The printed circuit board 30 comprises the printed circuit board body 31 and the printed circuit board convex portion 32. The printed circuit board convex portion 32 is arranged on one side of a width b extension direction of the printed circuit board body 31. At least one smaller first function module 10 is arranged on the printed circuit board body 31, and at least one larger second function module 20 is arranged on the printed circuit board convex portion 32, that is, the larger second function module 20 is arranged on the printed circuit board convex portion 32, and the smaller first function module 10 is arranged on the printed circuit board body 31, so that the width b of the printed circuit board body 31 may be made smaller. When the integrated module 100 is assembled on the intelligent device 1000, the printed circuit board convex portion 32 is used to connect with the intelligent device 1000 and may be hidden in the intelligent device 1000, and the second function module 20 is capable of being electrically connected with a core circuit board 202 of the intelligent device 1000. The printed circuit board body 31 connected to the printed circuit board convex portion 32 and the first function modules 10 arranged on the printed circuit board body 31 are extended to expose the intelligent device 1000, thereby realizing the low profile effect when the integrated module 100 is assembled. The entire intelligent device 1000 caused by the excessive width of the integrated module 100 is avoided, and the assembly of the integrated module 100 makes it appear abrupt and inconsistent.

Advantageous effect of the present disclosure is introduced as follows:

The integrated module of the present disclosure is directly integrated with multiple functional modules on the printed circuit board. When the integrated module is installed on the intelligent device, compared with the way of electrical connection through multiple wires in the existing technology, it greatly reduces the complexity of the internal wiring of the intelligent device and also saves costs.

The integrated module of the present disclosure comprises a printed circuit board body and a printed circuit board convex portion. The printed circuit board convex portion is arranged on one side of a width extension direction of the printed circuit board body. The second function module with larger volume is arranged on the printed circuit board convex portion, and the first function module with smaller volume is arranged on the printed circuit board body, so that the width of the printed circuit board body maybe made smaller, and the width of the printed circuit board body may be made less than 8.5±0.1 mm, thereby realizing the low profile effect during the assembly of the integrated module and avoiding the abrupt conflict of the entire intelligent device caused by the assembly of the integrated module due to the excessive width of the integrated module.

The integrated module of the present disclosure has simple structure, convenient and fast assembly, greatly improving production efficiency, and greatly reducing the error rate of factory assembly. At the same time, the integrated module provided by this embodiment has good assembly position, strong reusability and versatility, and is capable of being adapted to multiple models, avoiding the waste caused by one integrated module only corresponding to one model.

A length of the printed circuit board body 31 is greater than a length of the printed circuit board convex portion 32. The printed circuit board convex portion 32 is protruded from the printed circuit board body 31. This arrangement is capable of reducing the length of the printed circuit board body 31, and the larger second function module 20 is arranged on the printed circuit board convex portion 32, thereby reducing the width b required for most areas of the printed circuit board body 31, that is, reducing the width b of the printed circuit board body 31, so that the integrated module 100 may be assembled. There are few parts of the intelligent device 1000 exposed, which makes the whole intelligent device 1000 more harmonious and beautiful, and does not affect the realization of corresponding functions of each of the functional modules. The printed circuit board convex portion 32 is arranged in the middle of the printed circuit board body 31.

In one embodiment, the length a of the printed circuit board body 31 is less than 170 mm. Optionally, the length a of the printed circuit board body 31 is 160±0.3 mm.

In one embodiment, the length c of the printed circuit board convex portion 32 is less than 40 mm. Optionally, the length c of the printed circuit board convex portion 32 is 37±0.2 mm.

In one embodiment, the width d of the printed circuit board convex portion 32 is less than 6 mm. Optionally, the width d of the printed circuit board convex portion 32 is 5.5±0.1 mm.

In one embodiment, the thickness of the printed circuit board 30 is less than 1.3 mm. Optionally, the thickness of the printed circuit board 30 is 1.2±0.02 mm.

The height of each of the first function modules 10 and each of the second function modules 20 above the printed circuit board 30 is less than 1.6 mm. Optionally, the height of each of the first function modules 10 and each of the second function modules 20 above the printed circuit board 30 is 1.5±0.02 mm.

The length a of the printed circuit board body 31, the length c of the printed circuit board convex portion 32, the width d of the printed circuit board convex portion 32, the thickness of the printed circuit board 30, the height of each of the first function modules 10, and each of the second function modules 20 above the printed circuit board 30 are not limited to the above values, which are not limited thereto.

Please refer to FIGS. 1 and 3. Each of the second function modules 20 comprises an IC chip 21 and a socket 22. The IC chip 21 is arranged on the printed circuit board convex portion 32. The socket 22 is arranged on the printed circuit board convex portion 32, and the socket 22 is electrically connected with the IC chip 21. The larger IC chip 21 and the socket 22 are arranged on the printed circuit board convex portion 32, which greatly reduces the width of the printed circuit board body 31 and achieves the low profile effect during assembly. Optionally, the socket 22 is a flexible flat cable (FFC) socket.

Please refer to FIGS. 1 and 3. Each of the first function modules 10 comprises an antenna module 11. The antenna module 11 comprises a Wi-Fi antenna unit 111 and a Bluetooth antenna 112. The Wi-Fi antenna unit 111 is arranged on one side of the printed circuit board body 31, and the Wi-Fi antenna unit 111 is electrically connected with the IC chip 21. The Bluetooth antenna 112 is arranged on one side of the printed circuit board body 31 and electrically connected with the IC chip 21. The Wi-Fi antenna unit 111 and the Bluetooth antenna 112 are electrically connected with IC chip 21, thereby ensuring the realization of Wi-Fi and Bluetooth functions. The Wi-Fi antenna unit 111 and the Bluetooth antenna 112 are both located on one side of the printed circuit board body 31, and the volume of the Wi-Fi antenna unit 111 and the Bluetooth antenna 112 is small, which is capable of reducing the width b of the printed circuit board body 31.

The Wi-Fi antenna unit 111, the Bluetooth antenna 112, the IC chip 21, and the socket 22 are all located on the same side of the printed circuit board 30. The printed circuit board 30 is equipped with the Wi-Fi antenna unit 111, the Bluetooth antenna 112, the IC chip 21, and one side of the socket 22 is marked as a first side 301.

Please continue to refer to FIGS. 1 and 3. The Wi-Fi antenna unit 111 comprises a first Wi-Fi antenna 1111 and a second Wi-Fi antenna 1112. The first Wi-Fi antenna 1111 is arranged at one end of the printed circuit board body 31 and electrically connected with the IC chip 21. The second Wi-Fi antenna 1112 is arranged at the other end of the printed circuit board body 31 and electrically connected with the IC chip 21. The Bluetooth antenna 112 is arranged between the first Wi-Fi antenna 1111 and the second Wi-Fi antenna 1112. A first gap 311 is disposed between the first Wi-Fi antenna 1111 and the Bluetooth antenna 112, and a second gap 312 is disposed between the Bluetooth antenna 112 and the second Wi-Fi antenna 1112. The first Wi-Fi antenna 1111 is arranged at one end of the printed circuit board body 31, that is, the first Wi-Fi antenna 1111 is arranged at the end of the length extension direction of the printed circuit board body 31. The second Wi-Fi antenna 1112 is arranged at the other end of the printed circuit board body 31, that is, the second Wi-Fi antenna 1112 is arranged at the end of the other end of the length extension direction of the printed circuit board body 31 to enhance signal reception. When the Bluetooth antenna 112 is disposed between the first Wi-Fi antenna 1111 and the second Wi-Fi antenna 1112, the first gap 311 is formed between the first Wi-Fi antenna 1111 and the Bluetooth antenna 112, and the second gap 312 is formed between the Bluetooth antenna 112 and the second Wi-Fi antenna 1112, which is capable of preventing signal interference.

Please refer to FIGS. 1 and 3. Each of the first function modules 10 further comprises a key switch 12, which is arranged on one side of the printed circuit board body 31 and electrically connected with the IC chip 21. The key switch 12 is located at the first gap 311 or the second gap 312. Because the key switch 12 is small in size, when the key switch 12 is placed on the printed circuit board body 31, the width of the printed circuit board body 31 may be reduced, and the key switch 12, the first Wi-Fi antenna 1111, the second Wi-Fi antenna 1112, the Bluetooth antenna 112, the IC chip 21, and the socket 22 are located on the same side of the printed circuit board 30. That is, the key switch 12 is also located on the first side 301. When the integrated module 100 is assembled, the first side 301 of the printed circuit board 30 is assembled towards the side of the backplane 204 near the intelligent device 1000.

A first side 301 is also provided with a first refuge area 3011 and a second refuge area 3012. The first refuge area 3011 is located in the first gap 311, and the second refuge area 3012 is located in the second gap 312. The first refuge area 3011 and the second refuge area 3012 are both paved with copper for grounding. Optionally, the first side 301 is also provided with a third refuge area 3013 and a fourth refuge area 3014, and the third refuge area 3013 is located in the first gap 311, and the fourth refuge area 3014 is located in the second gap 312.

Please refer to FIGS. 2 and 3. Each of the first function modules 10 comprises a far-field voice circuit 13, a photo-sensor 14, an infrared remote controller 15, and an indicator lamp 16. The far-field voice circuit 13, the light sensing unit 14, the infrared remote controller 15, and the indicator lamp 16 are electrically connected with the IC chip 21. The far-field voice circuit 13 is used to realize the voice control of the intelligent device 1000. The photosensor 14 is used to automatically adjust the brightness of a display 203 of the intelligent device 1000. The infrared remote controller 15 is used to realize the infrared control of the intelligent device 1000. Because the volume of the far-field voice circuit 13, the photosensor 14, the infrared remote controller 15, and the indicator lamp 16 is small, they may be arranged on the printed circuit board body 31 to reduce the width of the printed circuit board body 31 and achieve low profile. Optionally, the far-field voice circuit 13, the photosensor 14, the infrared remote controller 15, and the indicator lamp 16 are all located on the other side of the printed circuit board body 31, which is marked as a second side 302. Optionally, an amount of the far-field voice circuits 13 is two, and both are located on the second side 302 to increase the reception effect. When the integrated module 100 in this embodiment is assembled, the second side 302 is assembled towards one side of the display 203 close to the intelligent device 1000, which is convenient for the far-field voice circuit 13, the photosensor 14, the infrared remote controller 15, and the indicator lamp 16 to realize the corresponding functions.

Please refer to FIGS. 4 and 5. The intelligent device 1000 comprises a device body 200 and the integrated module 100 mentioned above, which is connected with the device body 200. Since the structure of the integrated module 100 has been described in detail above, it will not be repeated here.

A bottom of the device body 200 is provided with a insertion portion 201, the printed circuit board convex portion 32 is inserted in the insertion portion 201 and connected with the device body 200, and the printed circuit board body 31 extends out of the bottom of the device body 200. The intelligent device 1000 comprises the core circuit board 202, and each of the second function modules 20 is electrically connected with the core circuit board 202. When the printed circuit board convex portion 32 is inserted into the insertion portion 201, the printed circuit board convex portion 32 and each of the second function modules 20 are both inserted into the insertion portion 201, and the connection is stable. At the same time, each of the second function modules 20 is electrically connected with the core circuit board 202, that is, the socket 22 is electrically connected with the core circuit board 202.

The intelligent device 1000 further comprises a shell 300, which is installed outside the integrated module 100 and connected with the device body 200. The arrangement of the shell 300 covers the integrated module 100 and protects the integrated module 100, and does not affect the realization of the functions of the functional modules on the printed circuit board 30. Optionally, the shell 300 is made of plastic.

The intelligent device 1000 is an intelligent television (TV). The intelligent device 1000 is not only limited to the intelligent TV, but also other devices, which are not limited thereto.

An embodiment of the present disclosure is directed to an integrated module 100. The integrated module 100 includes a first function module 10, a second function module 20, and a printed circuit board 30. The printed circuit board 30 includes a printed circuit board body 31 and a printed circuit board convex portion 32. The first function module 10 is arranged on the printed circuit board body 31. The printed circuit board convex portion 32 is arranged on one side of the printed circuit board body 31 and connected to the printed circuit board body 31. The second function module 20 is arranged on the printed circuit board convex portion 32. Another embodiment of the present disclosure is directed to an intelligent device 1000 that includes a device body 200 and the integrated module 100 connected thereto. The integrated module 100 of the present disclosure is directly integrated with multiple functional modules on the printed circuit board 30. When the integrated module 100 is installed on the intelligent device 1000, compared with the way of electrical connection through multiple wires in the existing technology, it greatly reduces the complexity of the internal wiring of the intelligent device 1000 and also saves costs. The PCB 30 of the present disclosure comprises a printed circuit board body 31 and a printed circuit board convex portion 32. The printed circuit board convex portion 32 is arranged on one side of a width extension direction of the printed circuit board body 31. The second function module 20 with larger volume is arranged on the printed circuit board convex portion 32, and the first function module 10 with smaller volume is arranged on the printed circuit board body 31, so that the width of the printed circuit board body 31 maybe made smaller, and the width of the printed circuit board body 31 may be made less than 8.5±0.1 mm, thereby realizing the low profile effect during the assembly of the integrated module 100 and avoiding the abrupt conflict of the entire intelligent device 1000 caused by the assembly of the integrated module 100 due to the excessive width of the integrated module 100. The integrated module 100 of the present disclosure has simple structure, convenient and fast assembly, greatly improving production efficiency, and greatly reducing the error rate of factory assembly. At the same time, the integrated module 100 provided by this embodiment has good assembly position, strong reusability and versatility, and is capable of being adapted to multiple models, avoiding the waste caused by one integrated module only corresponding to one model.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. An integrated module, comprising:
a first function module;
a second function module; and
a printed circuit board, which comprising:

a printed circuit board body, wherein the first function module is arranged on the printed circuit board body;

a printed circuit board convex portion, arranged on one side of the printed circuit board body and connected to the printed circuit board body, wherein the second function module is arranged on the printed circuit board convex portion;

wherein the second function module having a relatively larger volume is disposed on the printed circuit board convex portion, the first function module having a relatively smaller volume is disposed on the printed circuit board body;

wherein the second function module comprises an IC chip and a socket and has a larger physical volume, and wherein the first function module comprises at least one antenna module and has a smaller physical volume, wherein the printed circuit board convex portion is configured to accommodate the second function module so as to spatially separate the second function module from the printed circuit board body, thereby enabling the printed circuit board body to maintain a reduced width suitable for low-profile installation, wherein the reduced width is less than 8.5±0.1 mm.

2. The integrated module as claimed in claim 1, wherein a length of the printed circuit board body is greater than a length of the printed circuit board convex portion, and the printed circuit board convex portion is protruded from the printed circuit board body.

3. The integrated module as claimed in claim 1, wherein the IC chip, is arranged on the printed circuit board convex portion; and wherein the socket, is arranged on the printed circuit board convex portion and electrically connected with the IC chip.

4. The integrated module as claimed in claim 3, wherein the at least one antenna module, which comprises:

a Wi-Fi antenna unit, is arranged on one side of the printed circuit board body and electrically connected with the IC chip; and a Bluetooth antenna, is arranged on one side of the printed circuit board body and electrically connected with the IC chip.

5. The integrated module as claimed in claim 4, wherein the Wi-Fi antenna unit comprises:

a first Wi-Fi antenna, is arranged at one end of the printed circuit board body and electrically connected with the IC chip;

a second Wi-Fi antenna, is arranged at the other end of the printed circuit board body and electrically connected with the IC chip;

the Bluetooth antenna is arranged between the first Wi-Fi antenna and the second Wi-Fi antenna, and a first gap is disposed between the first Wi-Fi antenna and the Bluetooth antenna, a second gap is disposed between the Bluetooth antenna and the second Wi-Fi antenna.

6. The integrated module as claimed in claim 5, wherein the first function module further comprises a key switch, which is arranged on one side of the printed circuit board body and electrically connected with the IC chip; and the key switch is located at the first gap or the second gap.

7. The integrated module as claimed in claim 3, wherein the first functional module comprises:

a far-field voice circuit, is arranged on the other side of the printed circuit board body and electrically connected with the IC chip.

8. The integrated module as claimed in claim 3, wherein the first functional module comprises:

a photosensor, is arranged on the other side of the printed circuit board body and electrically connected with the IC chip.

9. The integrated module as claimed in claim 3, wherein the first functional module comprises:

an infrared remote controller, is arranged on the other side of the printed circuit board body and electrically connected with the IC chip.

10. The integrated module as claimed in claim 3, wherein the first functional module comprises:

an indicator lamp, is arranged on the other side of the printed circuit board body and electrically connected with the IC chip.

11. An intelligent device, comprising a device body and an integrated module connected thereto, the integrated module comprising:

a first function module;

a second function module; and a printed circuit board, which comprising:

a printed circuit board body, wherein the first function module is arranged on the printed circuit board body;

a printed circuit board convex portion, arranged on one side of the printed circuit board body and connected to the printed circuit board body, wherein the second function module is arranged on the printed circuit board convex portion;

wherein the second function module having a relatively larger volume is disposed on the printed circuit board convex portion, the first function module having a relatively smaller volume is disposed on the printed circuit board body;

wherein the second function module comprises an IC chip and a socket and has a larger physical volume, and wherein the first function module comprises at least one antenna module and has a smaller physical volume, wherein the printed circuit board convex portion is configured to accommodate the second function module so as to spatially separate the second function module from the printed circuit board body, thereby enabling the printed circuit board body to maintain a reduced width suitable for low-profile installation, wherein the reduced width is less than 8.5±0.1 mm.

12. The intelligent device as claimed in claim 11, wherein a length of the printed circuit board body is greater than a length of the printed circuit board convex portion, and the printed circuit board convex portion is protruded from the printed circuit board body.

13. The integrated module as claimed in claim 11, wherein the IC chip, is arranged on the printed circuit board convex portion; and wherein the socket, is arranged on the printed circuit board convex portion and electrically connected with the IC chip.

14. The intelligent device as claimed in claim 13 wherein the at least one antenna module, which comprises:

a Wi-Fi antenna unit, is arranged on one side of the printed circuit board body and electrically connected with the IC chip; and a Bluetooth antenna, is arranged on one side of the printed circuit board body and electrically connected with the IC chip.

15. The intelligent device as claimed in claim 14, wherein the Wi-Fi antenna unit comprises:

a first Wi-Fi antenna, is arranged at one end of the printed circuit board body and electrically connected with the IC chip;

a second Wi-Fi antenna, is arranged at the other end of the printed circuit board body and electrically connected with the IC chip;

the Bluetooth antenna is arranged between the first Wi-Fi antenna and the second Wi-Fi antenna, and a first gap is disposed between the first Wi-Fi antenna and the Bluetooth antenna, a second gap is disposed between the Bluetooth antenna and the second Wi-Fi antenna.

16. The intelligent device as claimed in claim 15, wherein the first function module further comprises a key switch, which is arranged on one side of the printed circuit board body and electrically connected with the IC chip; and the key switch is located at the first gap or the second gap.

17. The intelligent device as claimed in claim 13, wherein the first functional module comprises:

a far-field voice circuit, is arranged on the other side of the printed circuit board body and electrically connected with the IC chip.

18. The intelligent device as claimed in claim 13, wherein the first functional module comprises:

a photosensor, is arranged on the other side of the printed circuit board body and electrically connected with the IC chip.

19. The intelligent device as claimed in claim 11, wherein a bottom of the device body is provided with a connector, the printed circuit board convex portion is inserted in the connector to connect with the device body, and the printed circuit board body extends out of the bottom of the device body; and the intelligent device comprises a core circuit board, and the second function modules are electrically connected with the core circuit board.

20. The intelligent device as claimed in claim 11, further comprising a shell arranged outside the integrated module and connected with the device body.

\* \* \* \* \*